US006301095B1

(12) United States Patent
Laughlin et al.

(10) Patent No.: US 6,301,095 B1
(45) Date of Patent: Oct. 9, 2001

(54) SYSTEM AND METHOD OF DISTRIBUTING POWER TO A PLURALITY OF ELECTRONIC MODULES HOUSED WITHIN AN ELECTRONICS CABINET

(75) Inventors: Kenneth S. Laughlin, Arlington Heights; Laura M. Bendikas, Chicago; Daniel J. Lecinski, Arlington Heights, all of IL (US)

(73) Assignee: 3COM Corporation, Rolling Meadows, IL (US)

( * ) Notice: Subject to any disclaimer, the term of this patent is extended or adjusted under 35 U.S.C. 154(b) by 0 days.

(21) Appl. No.: 09/471,781

(22) Filed: Dec. 23, 1999

(51) Int. Cl.[7] ....................................... H02B 1/04
(52) U.S. Cl. ..................... 361/624; 174/59; 361/648
(58) Field of Search ................... 307/112, 113; 174/50, 59, 68.2; 455/347, 349; 439/733, 724; 361/110, 111, 614, 601, 622, 624, 641, 644, 648, 657, 678, 724, 725, 727, 733

(56) References Cited

U.S. PATENT DOCUMENTS

| 3,723,884 | * | 3/1973 | Asplin ................................ 455/307 |
| 3,848,224 | * | 11/1974 | Olivero ............................... 439/721 |
| 5,053,910 | * | 10/1991 | Goldstein ............................ 361/111 |
| 5,055,059 | * | 10/1991 | Logstrup ............................. 439/214 |
| 5,184,280 | * | 2/1993 | Fouad ................................. 361/648 |
| 5,245,527 | * | 9/1993 | Duff et al. ......................... 363/131 |
| 5,684,671 | * | 11/1997 | Hobbs et al. ...................... 361/683 |
| 5,969,931 | * | 10/1999 | Maeda et al. ...................... 361/117 |
| 6,002,580 | * | 12/1999 | LeVantine et al. ................ 361/634 |
| 6,064,001 | * | 5/2000 | Ulerich et al. ..................... 174/50 |
| 6,078,503 | * | 6/2000 | Gallagher et al. ................. 361/725 |

* cited by examiner

Primary Examiner—Gerald Tolin
(74) Attorney, Agent, or Firm—Baniak Pine & Gannon

(57) ABSTRACT

A system for distributing power to a plurality of electronic modules housed within an electronics cabinet includes an electronics cabinet and at least one power filter mounted to the electronics cabinet. At least one electronic module is housed within the electronics cabinet. A first bus bar is positioned within the electronics cabinet for receiving at least one power input cable. A second bus bar is positioned within the electronics cabinet and is electrically connected to the first bus bar and to the power filter. The second bus bar routes input power from the first bus bar to the power filter and routes filtered power to the at least one electronic module.

25 Claims, 8 Drawing Sheets

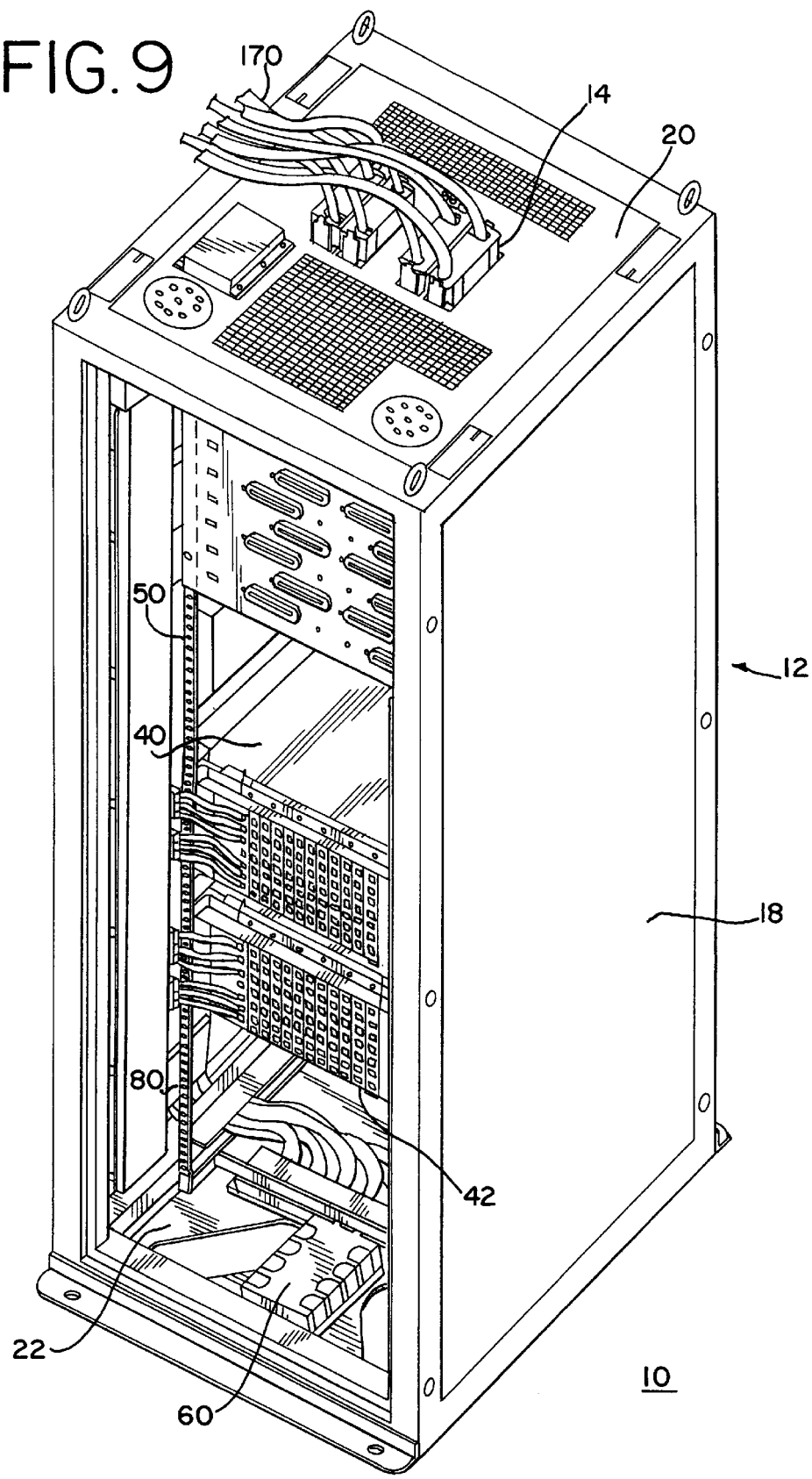

SYSTEM AND METHOD OF DISTRIBUTING POWER TO A PLURALITY OF ELECTRONIC MODULES HOUSED WITHIN AN ELECTRONICS CABINET

FIELD OF THE INVENTION

This invention relates generally to the field of power distribution systems. In particular, this invention relates to a system and method of distributing power to a plurality of electronic modules housed within an electronics cabinet.

BACKGROUND OF THE INVENTION

Electronic modules for high-speed telecommunication and networking applications are typically housed in an electronics cabinet. The electronic modules may each contain, for example, various high-speed application cards, switching cards, network access servers, and ingress and egress cards. A vertically oriented rack is positioned within the cabinet, and the electronic modules are fastened to the rack. The electronic modules are positioned one on top of the other in a vertically oriented configuration.

Power is typically routed to the cabinet via input power cables that enter the cabinet from above. The input power cables may, however, introduce unwanted noise and other transients into the cabinet, which may have an adverse effect on the various electronic components housed within the cabinet. To overcome this problem, power line filters (i.e., RFI Filters) are mounted along the top wall of the cabinet to provide filtered power to the electronic modules within the cabinet.

When power is introduced into the cabinet from above, the input power cables are attached directly to the input terminals of the filters. The filters are in turn connected to a power distribution panel or breaker panel, which is mounted within the cabinet. Filtered power is then delivered from the power distribution panel to the various electronic modules within the cabinet.

A large number of cables are typically required to deliver power from the distribution panel to the plurality of electronic modules within the cabinet. Each of these cables is typically hardwired at the distribution panel and at the electronic modules. The disadvantage of this arrangement is that the removal of one or more of the electronic modules from the cabinet may disturb the surrounding electronic modules due to the removal or rerouting of cables to and from the distribution panel. In addition, the removal or rerouting of cables is a labor-intensive process. Similarly, the removal and replacement of the distribution panel is also a labor-intensive process due to the large number of hardwired connections at the panel and at the various electronic modules within the cabinet. Moreover, the large number of cables occupies a considerable amount of space in the cabinet, which typically has strict dimensional requirements. They also block airflow through the cabinet, which may result in the overheating of the electronic components in the various electronic chassis. The large number of cables may also results in the generation of significant amounts of electromagnetic interference.

Oftentimes electronics cabinets are positioned on a raised computer floor, and the input power cables must be routed into the cabinet through the bottom wall of the cabinet. However, in order to filter the input power, the input power cables typically have to be routed up through the cabinet so that they exit through the top wall of the cabinet for connection to the filters. These additional cables also require a large amount of space within the cabinet, and further complicate the cable routing process within the cabinet. Also, these additional cables may also result in increased levels of electromagnetic interference within the cabinet.

Accordingly, it would be desirable to have a system and method of distributing power to a plurality of electronic modules housed within an electronics cabinet that overcomes the problems described above.

SUMMARY OF THE INVENTION

One aspect of the invention provides a system for distributing power to a plurality of electronic modules housed within an electronics cabinet including an electronics cabinet and at least one power filter mounted to the electronics cabinet The at least one power filter may preferably include four power filters. At least one electronic module is housed within the electronics cabinet. A first bus bar is positioned within the electronics cabinet for receiving at least one power input cable. A second bus bar is positioned within the electronics cabinet and is electrically connected to the first bus bar and to the power filter. The second bus bar routs input power from the first bus bar to the power filter and routs filtered power to the at least one electronic module. The electronics cabinet may preferably include a first sidewall, a second sidewall, a top wall and a bottom wall. The bottom wall may preferably include at least one opening adjacent to the first bus bar to allow a plurality of power input cables to be routed into the electronics cabinet. The at least one power filter may preferably be mounted to the top wall of the electronics cabinet. The first bus bar may preferably be mounted to the bottom wall of the electronics cabinet and the second bus bar may be positioned within the electronics cabinet adjacent to the first sidewall and may extend along a length of the first sidewall. The second bus bar may preferably include at least one power input connector to receive filtered power. The at least one power input connector may preferably be a six position connector. The at least one power input connector may preferably be comprised of four power input connectors. The second bus bar may also preferably include at least one power output connector to provide power to the at least one electronic module. The at least one output connector may preferably be a three position connector. The at least one power output connector may preferably be comprised of ten power output connectors. The second bus bar may preferably be comprised of a plurality of conductive layers. The plurality of conductive layers may preferably include a first conductive layer for transmitting power from the first bus bar to the power filter and a second conductive layer for transmitting filtered power from the power filter to the at least one electronic module. The second bus bar may preferably be a generally planar member having a rectangular shape. The first bus bar may preferably include a plurality of input terminals to receive a plurality of power input cables. A first protective cover may preferably cover the plurality of input terminals. The first bus bar may preferably include a plurality of output terminals. A second protective cover may preferably cover the plurality of output terminals. A first conductor may preferably electrically connect the first bus bar to the second bus bar to rout the input power from the first bus bar to the second bus bar. A second conductor may preferably be electrically connected to the second bus bar and may extend to a top wall of the electronics cabinet to rout power from the second bus bar to the top wall of the electronics cabinet. A third conductor may preferably be electrically connected to the second conductor and to the power filter to rout power from the second bus bar to the power filter. A power distribution panel may preferably be mounted within the electronics cabinet and may be electrically connected to the power filter and to second bus bar. A fourth conductor may preferably be electrically connected to the power distribution panel and to the second bus bar to rout filtered power from the power distribution panel to the second bus bar.

Another aspect of the invention provides a system for distributing power to a plurality of electronic modules housed within an electronics cabinet including an electronics cabinet and at least one power filter mounted to the electronics cabinet. A power distribution panel is positioned within the electronics cabinet and is electrically connected to the at least one power filter. At least one electronic module is housed within the electronics cabinet. A bus bar is positioned within the electronics cabinet adjacent to a sidewall of the electronics cabinet and extends along a length of the sidewall. The bus bar includes at least one power input connector and at least one power output connector. A conductor is electrically connected to the power distribution panel and to the at least one power input connector to rout filtered power from power distribution panel to the at least one electronic module.

Another aspect of the invention provides a method of distributing power to a plurality of electronic modules housed within an electronics cabinet. An electronics cabinet and at least one power filter mounted to the electronics cabinet is provided. At least one electronic module is housed within the cabinet. A first bus bar is positioned within the cabinet and a second bus bar is positioned within the cabinet. At least one power input cable is electrically connected to the first bus bar, and the first bus bar is electrically connected to the second bus bar. The second bus bar is electrically connected to the power filter. Input power is routed from the first bus bar to the second bus bar. Input power in then routed from the second bus bar to the power filter. Filtered power is routed from the power filter to the second bus bar, and from the second bus bar to the at least one electronic module. A power distribution panel may also be provided. The power filter may preferably be electrically connected to the power distribution panel. The power distribution panel may preferably be electrically connected to the second bus bar. Filtered power may preferably be routed from the power filter to the power distribution panel and routed from the distribution panel to the second bus bar.

Another aspect of the invention provides a method of distributing power to a plurality of electronic modules housed within an electronics cabinet. An electronics cabinet and at least one power filter mounted to the electronics cabinet is provided. A power distribution panel is positioned within the electronics cabinet and is electrically connected to the at least one power filter. At least one electronic module is housed within the electronics cabinet. A bus bar is positioned within the electronics cabinet adjacent to a sidewall of the electronics cabinet and extends along a length of the sidewall. The bus bar includes at least one power input connector and at least one power output connector. The at least one power input cable is electrically connected to the power filter. A conductor is electrically connected to the power distribution panel and to the at least one power input connector. Input power is routed to the power filter. Filtered power is routed from the power filter to the distribution panel. Filtered power is then routed from the distribution panel to the bus bar. Finally, filtered power is routed from the bus bar to the at least one electronic module. Earth ground may preferably be routed from the bus bar to the at least one electronic module.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

BRIEF DESCRIPTION OF THE DRAWINGS

FIG. 9 is a perspective view of the embodiment of FIG.1 showing input power being routed into the electronics cabinet from above.

DETAILED DESCRIPTION OF THE PRESENTLY PREFERRED EMBODIMENTS

Figure 1:
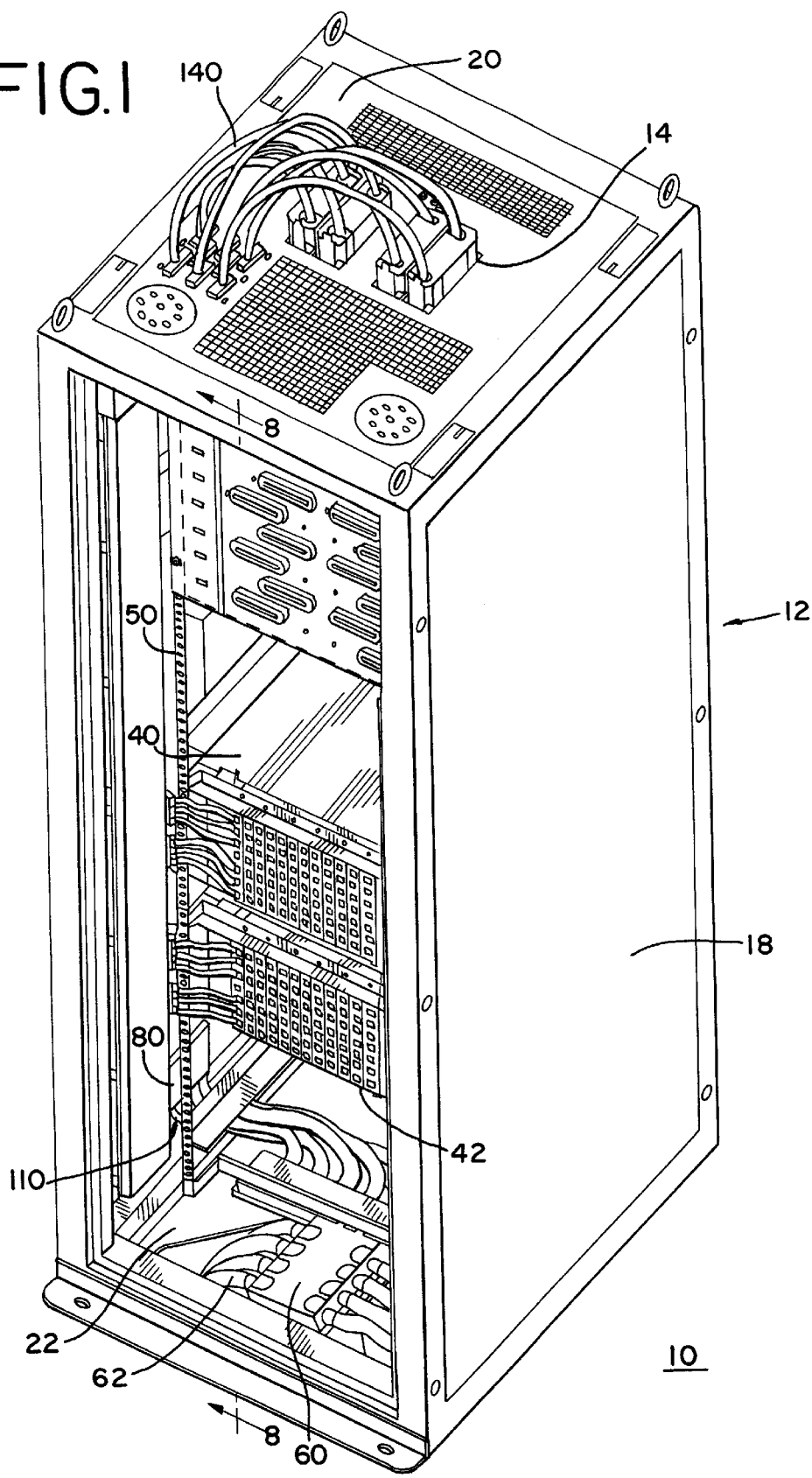
FIG. 1 is a perspective view of a preferred embodiment of a system for distributing power to a plurality of electronic modules housed within an electronics cabinet which is made in accordance with the invention.

FIG. 1 shows a preferred embodiment of a system 10 for distributing power to a plurality of electronic modules housed within an electronics cabinet. The system 10 includes an electronics cabinet 12 and at least one power filter 14 operatively connected to the electronics cabinet 12. As shown in greater detail in FIG. 7, four power filters 14, 15, 17, 19 are provided, although the number of power filters may vary depending upon the particular application. As shown in FIGS. 1, 8, and 9, the electronics cabinet 12 may preferably include a first sidewall 16 (see FIG. 8), a second sidewall 18, a top wall 20 and a bottom wall 22, although various shapes and configurations for the cabinet 12 are contemplated.

The electronics cabinet 12 may preferably be any suitable enclosure for housing various electronic devices. The electronics cabinet 12 may preferably be comprised of any rigid material suitable for housing electronic devices including, for example, steel, aluminum, etc.

Figure 7:
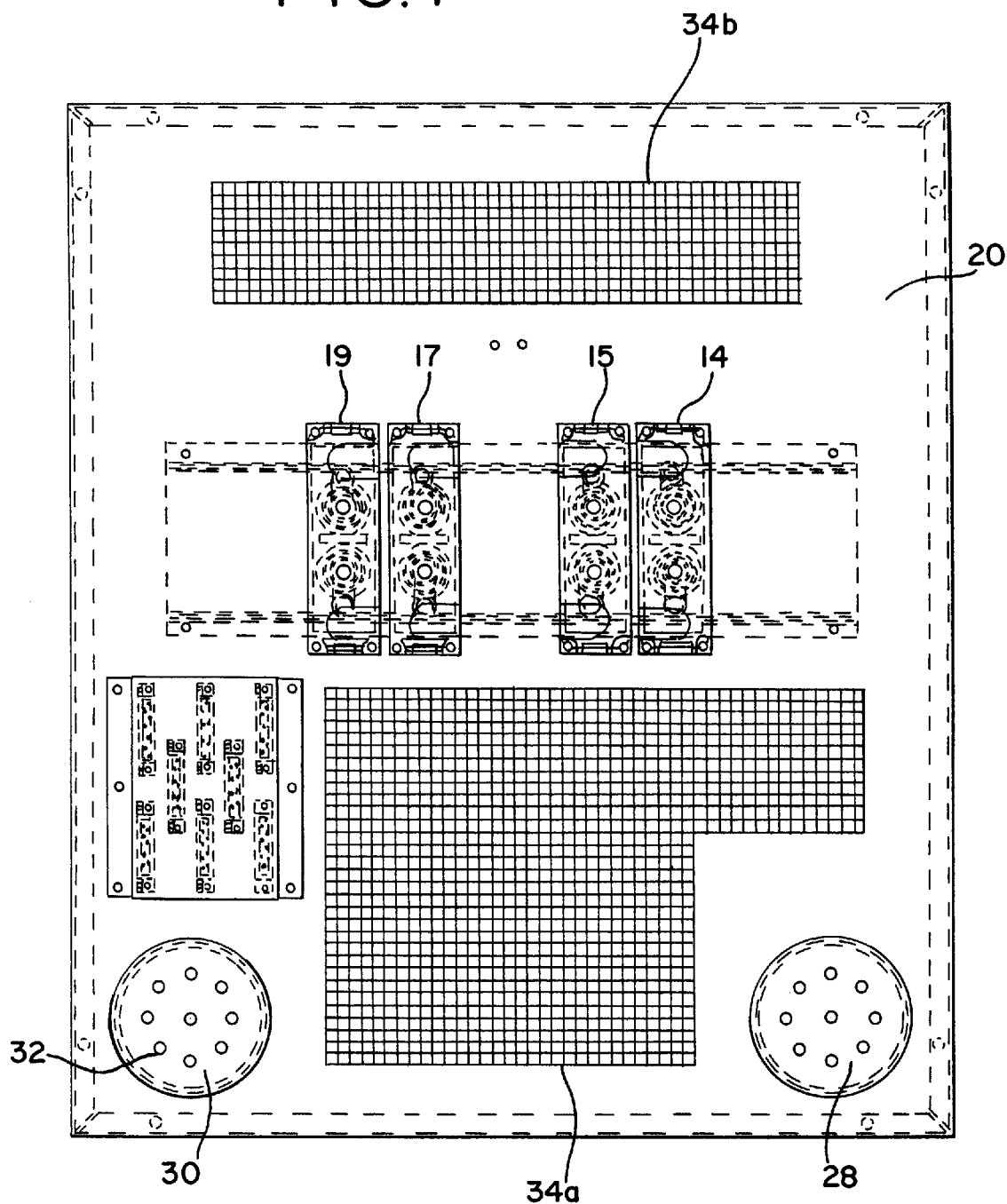
FIG. 7 is an enlarged top view of the electronics cabinet shown in FIG. 1.
Figure 8:
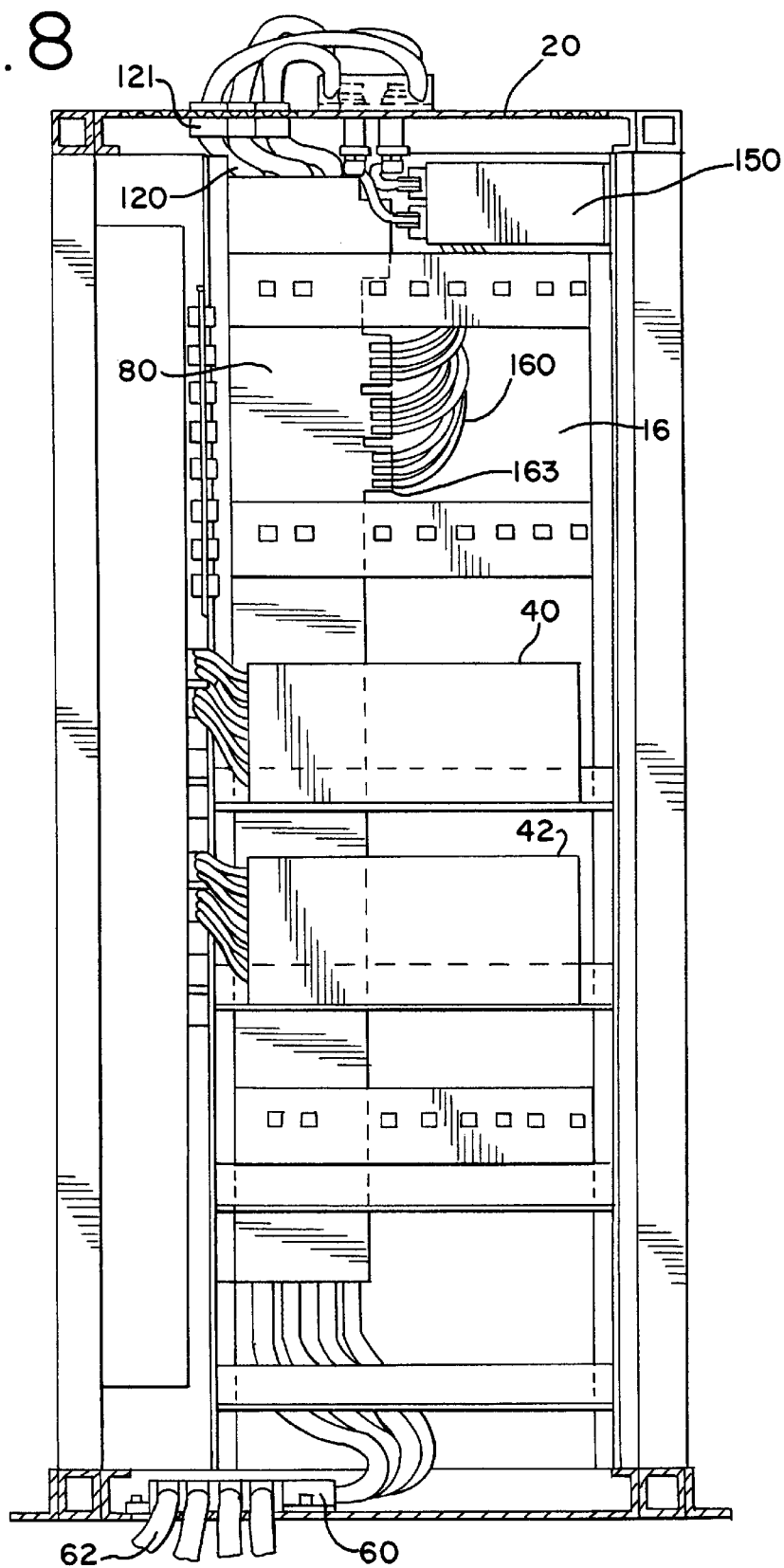
FIG. 8 is a sectional view taken along line 8—8 of FIG. 1.

As shown in FIGS. 1 and 7, each of the power filters 14, 15, 17, 19 may preferably be mounted to the top wall 20 of the electronics cabinet 12. The power filters 14, 15, 17, 19 may be secured to the top wall 20 in any conventional manner. The function of the power filters 14, 15, 17, 19 is to filter power that is routed into the cabinet 12. The power filters 14, 15, 17, 19 may be any of the commercially available power filters suitable for reducing electromagnetic interference such as, for example, radio frequency noise.

Figure 6:
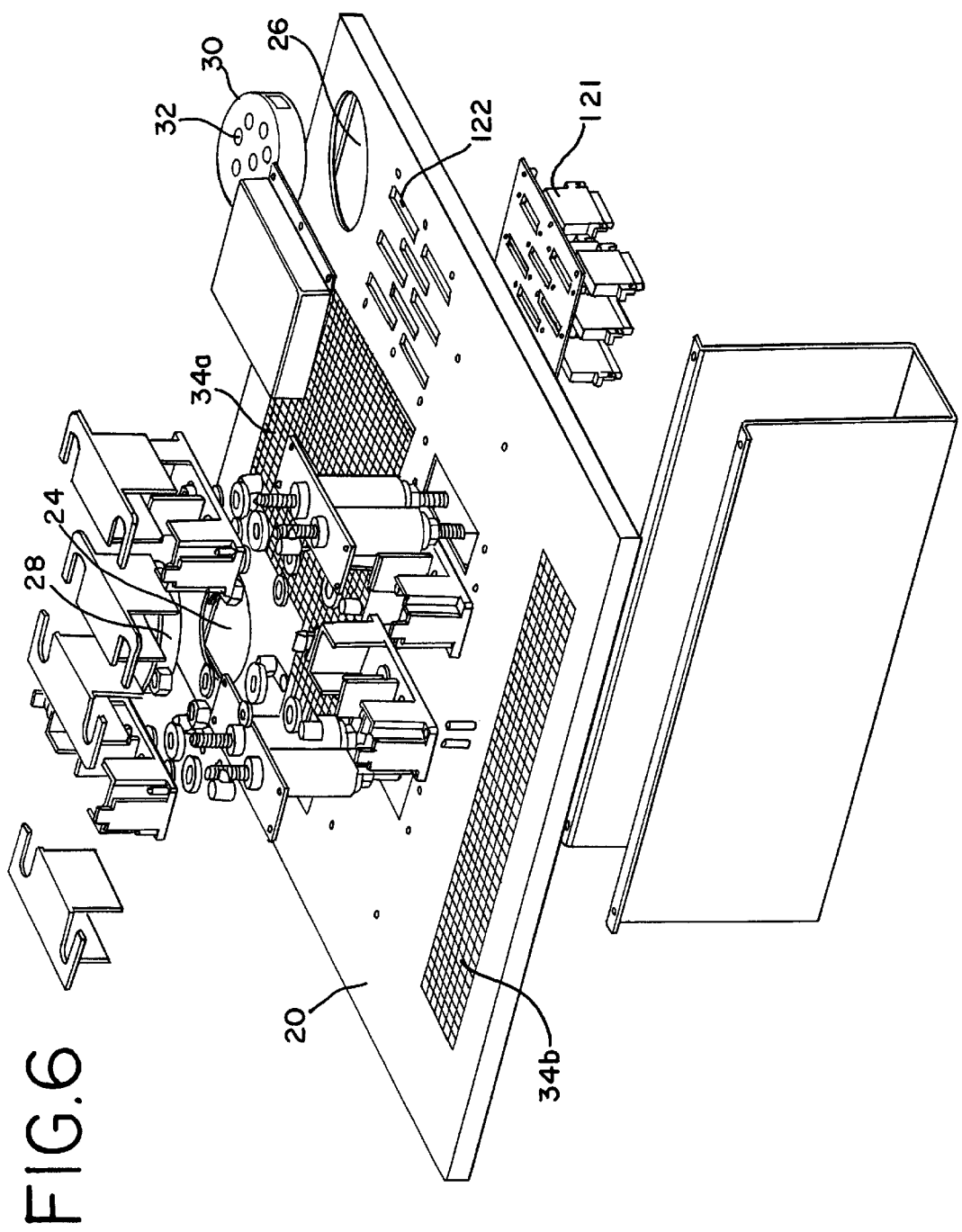
FIG. 6 is exploded perspective view of the top wall of the electronics cabinet shown in FIG. 1.

Referring to FIGS. 6 and 7, the top wall 20 of the electronics cabinet 12 may include a pair of data cable openings 24, 26 to allow the passage of data cables into the cabinet 12. A pair of covers 28, 30 each having a plurality of openings 32 may preferably be configured to be received into the pair of data cable openings 24, 26. The top wall 20 of the electronics cabinet 12 may also include perforated screen portions 34a, 34b to allow heated air from the within the cabinet 12 to be vented from the cabinet 12 while at the same suppressing electromagnetic interference generated within the cabinet 12.

Referring to FIGS. 1, 8, and 9, at least one electronic module 40 is housed within the electronics cabinet 12. In the embodiment shown, a plurality of electronic modules 40, 42 may preferably be positioned with the electronics cabinet 12. The electronic modules 40, 42 may preferably be any of the conventional electronic modules used for high-speed telecommunication and networking applications. The electronic modules 40, 42, may each contain, for example, various high-speed application cards, switching cards, network access servers, and ingress and egress cards. The number of electronic modules may vary depending upon the particular application.

As shown in FIGS. 1 and 9, a vertically oriented rack 50 may preferably be positioned within the cabinet 12, and the electronic modules 40, 42 may be fastened to the rack 50. The electronic modules 40, 42 may be positioned one on top of the other in a vertically oriented configuration.

Referring to FIGS. 1, 8, and 9 a first bus bar 60 is positioned within the electronics cabinet 12. The first bus 60 is adapted to receive at least one power input cable 62 (see FIGS. 1 and 8). In the embodiment shown in FIGS. 1 and 9, the first bus bar 60 is operatively mounted to the bottom wall 22 of the electronics cabinet 12. The first bus bar 60 may preferably be fastened to the bottom wall 22 in any conventional manner.

Figure 3:
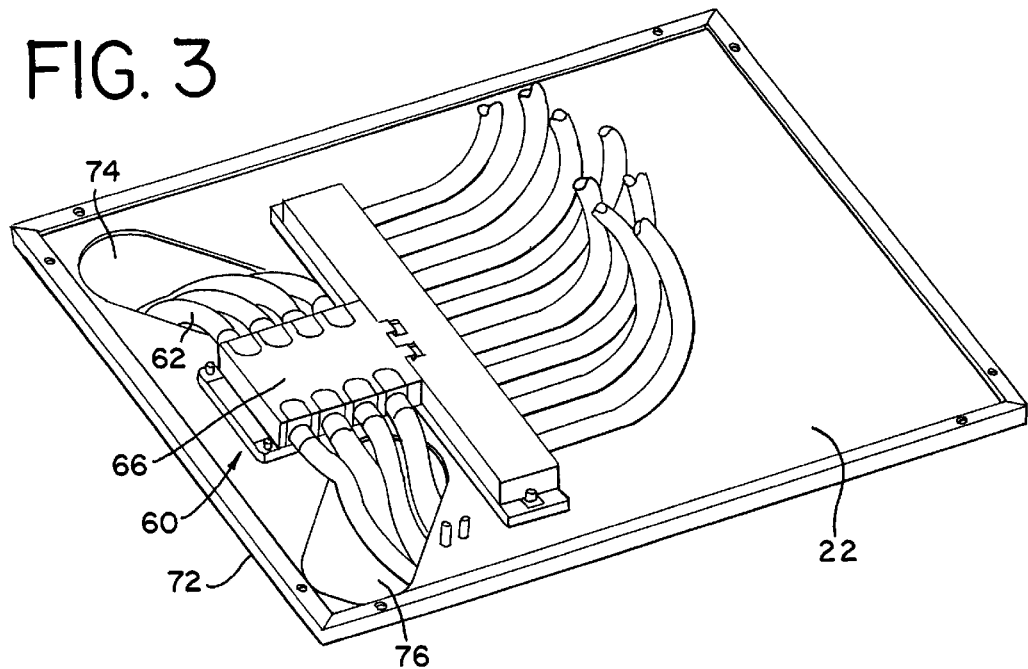
FIG. 3 is a enlarged perspective view of the first bus bar shown in FIG. 1 shown mounted to the bottom wall of the electronics cabinet.
Figure 4:
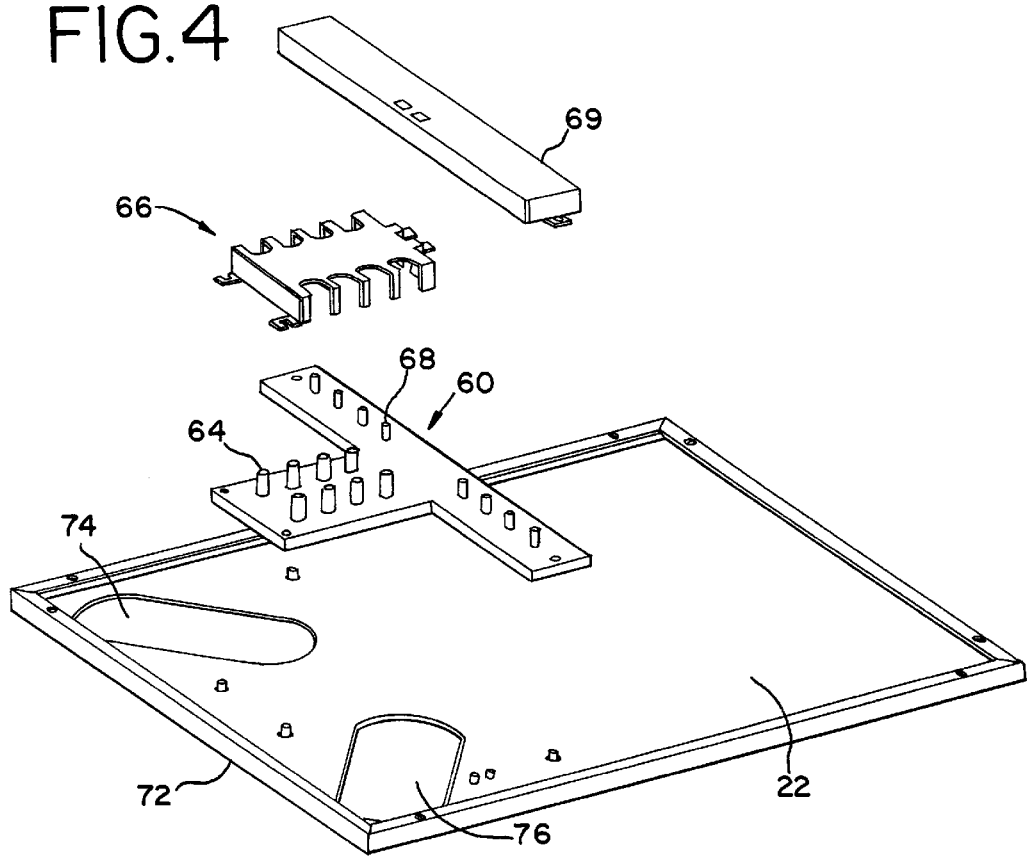
FIG. 4 is an exploded view of the embodiment of FIG. 3.

As shown in FIG. 4, the first bus bar 60 may preferably include a plurality of input terminals 64. In the embodiment shown, eight input terminals are provided which are arranged in two rows, although the number and configuration of input terminals may vary depending upon the particular application. As shown in FIG. 3, the input terminals 64 are adapted to receive a plurality of power input cables. The plurality of input terminals 64 may be comprised of, for example, conventional metal studs. As shown in FIG. 4, a first protective cover 66 may preferably be provided to cover the plurality of input terminals 64 to prevent against shock. The first protective cover 66 may preferably be comprised of any suitable insulative material.

Referring again to FIG. 4, the first bus bar 60 may also include a plurality of output terminals 68. In the embodiment shown, eight output terminals are provided which are arranged in a linear fashion, although the number and configuration of output terminals may vary depending upon the particular application. The plurality of output terminals 68 may be comprised of, for example, conventional metal studs. The plurality of output terminals 68 is electrically connected to the plurality of input terminals 64 via conductive layers that are insulated and disposed within the first bus bar 60. A second protective cover 69 may preferably be provided to cover the plurality of output terminals 68 to prevent shock. The second protective cover 69 may preferably be comprised of any suitable insulative material.

As shown in FIGS. 3 and 4, the first bus bar 60 may preferably have a planar T-shaped configuration, although other shapes and configurations for the first bus bar 60 are contemplated. The first bus bar 60 may preferably be positioned adjacent an end portion 72 of the bottom wall 22 of the cabinet 12 so that the input terminals 64 are more readily accessible to the end user.

Referring again to FIGS. 3 and 4, the bottom wall 22 of the electronics cabinet 12 may preferably include at least one opening 74 adjacent to the first bus bar 60 to allow the plurality of power input cables 62 to be routed into the electronics cabinet 12 from below. In the embodiment shown, for example, two openings 74 and 76 are provided. In addition to receiving power input cables, the openings 74 and 76 may also receive data cables which are then routed up into the cabinet 12.

As shown in FIGS. 1, 8 and 9, a second bus bar 80 is positioned within the electronics cabinet 12. As shown in greater detail in FIG. 8, the second bus bar 80 may preferably be positioned within the electronics cabinet 12 adjacent to the first sidewall 16 and may preferably extend along a length of the first sidewall 16. Alternatively, the second bus bar 80 may be located adjacent to the second sidewall 18 depending upon the particular application. As more fully explained below, the second bus bar 80 is electrically connected to the first bus bar 60 and to the power filters 14, 15, 17, and 19. The second bus bar 80 routes input power from the first bus bar 60 to the power filters 14, 15, 17, 19 and routes filtered power from the power filters 14, 15, 17, 19 to the electronic modules 40, 42 housed within the electronics cabinet 12.

Figure 2:
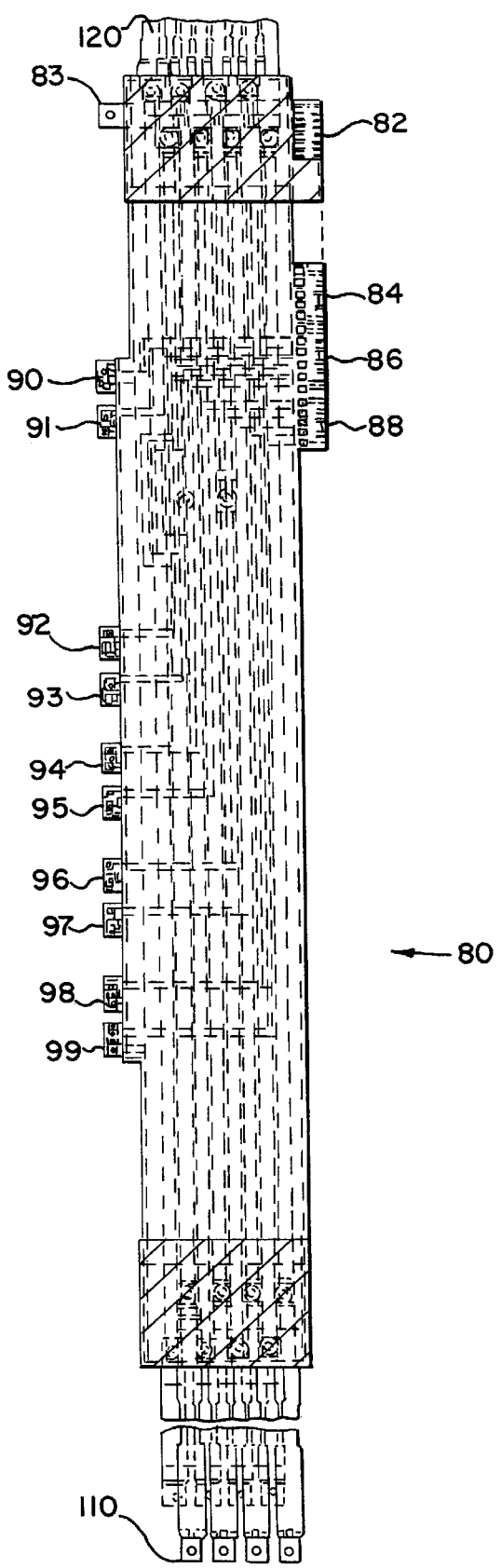
FIG. 2 is an enlarged plan view of the second bus bar shown in FIG. 1.

FIG. 2 is a plan view of the second bus bar 80. In the embodiment shown, the second bus bar 80 includes at least one power input connector 82 to receive filtered power from the power filter 14. In the embodiment shown, for example, four power input connectors 82, 84, 86 and 88 may be provided. The power input connectors 82, 84, 86, and 88 each may preferably be a six position connector, such as those manufactured by the Molex, Part No. 42820-6812. The number of power input connectors may vary depending upon the particular application.

The second bus bar 80 may also include at least one power output connector 90. The power output connector 90 provides filtered power from the second bus bar 80 to one of the electronic modules 40, 42. In the embodiment shown, for example, ten power output connectors 90, 91, 92, 93, 94, 95, 96, 97, 98 and 99 may preferably be provided to provide redundant power to the electronic modules 40, 42. The power output connectors 90, 91, 92, 93, 94, 95, 96, 97, 98 and 99 may each preferably be a three position connector, such as those manufactured by Molex, Part No. 42819-3232. In the embodiment shown, for example, each of the power output connectors 90, 91, 92, 93, 94, 95, 96, 97, 98, and 99 provide one position for power, one position for return, and one position for ground. As a result, each of the power output connectors 90, 91, 92, 93, 94, 95, 96, 97, 98, and 99 supplies DC power and ground to one of the electronic modules 40, 42. Power may preferably be provided to the modules 40, 42 in a redundant manner, although it should be understood that providing redundant power is not required. The number of power output connectors may vary depending upon the particular application.

The second bus bar 80 may preferably be comprised of a plurality of conductive layers that are isolated from one another. The conductive layers may preferably include a first conductive layer for transmitting power from the first bus bar 60 to each of the power filters 14, 15, 17, 19, a second conductive layer for transmitting filtered power from the power filters 14, 15, 17, 19 to the electronic modules 40, 42, and a third conductive ground layer. The third conductive ground layer is operatively connected to a ground connection post 83 as shown in FIG. 2. The ground connection post 83 may preferably be connected to ground in the cabinet 12 via a cable (not shown). The ground connection post 83 and the third conduction layer supplies ground to each of the electronic modules 40, 42 within the cabinet 12. Disposing the third conductive ground layer in the bus bar 80 has the benefit of reducing electromagnetic interference within the cabinet 12. The second bus bar 80 may preferably be a generally planar member having a rectangular shape, although other shapes and configurations are contemplated.

As shown in FIG. 2, the second bus bar 80 may preferably include at least one conductor 110 that extends from a first end of the second bus bar 80. In the embodiment shown, for example, eight conductors extend from the first end of the second bus bar 80. As shown in FIG. 1, the conductor 110 is operatively connected to an output terminal 68 of the first bus bar 60. The conductor 110 provides an electrical connection between the first bus bar 60 and the second bus bar 80. In particular, when input power is supplied to the cabinet 12 from below, the conductor 110 routes the input power from the first bus bar 60 to the second bus bar 80. The conductor 110 may preferably be hardwired to the first bus bar 60 and the second bus bar 80. In the embodiment shown, for example, eight conductors may be used to connect the eight output terminals 68 of the first bus bar 60 to the second bus bar 80. Each of the eight conductors may preferably be any conventional flexible conductor.

Figure 5:
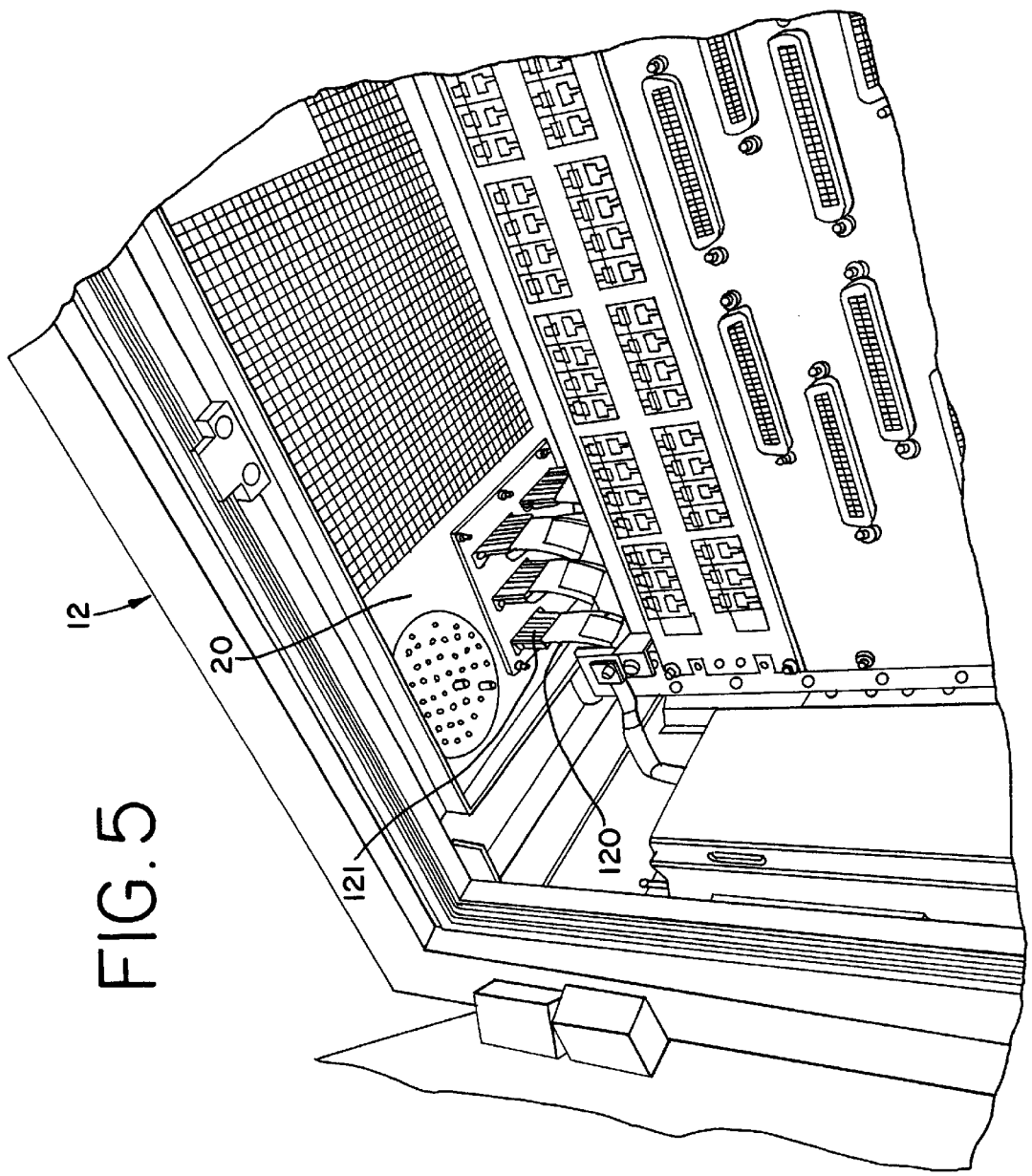
FIG. 5 is enlarged partial view of the inside top portion of the electronics cabinet shown in FIG. 1.

Referring again to FIGS. 2 and 8, the second bus bar 80 may preferably include at least one conductor 120 that extends from a second end of the second bus bar 80. In the embodiment shown, for example, eight conductors extend from the second end of the second bus bar 80. As shown in FIGS. 2, 5, and 8, the conductor 120 may preferably be electrically connected to the second bus bar 80 and may preferably terminate in a connector 121 (see FIGS. 5 and 8) that extends through the top wall 20 of the electronics cabinet 12. The conductor 120 routes input power from the second bus bar 80 to a position substantially coincidence with the top wall 20 of the electronics cabinet 12. One end of the conductor 120 may preferably be hard wired to the second bus bar 80 and the other end may include a connector 121 that extends through an opening 122 (see FIG. 6) in the top wall 20 of the electronics cabinet 12. The connector 121 is positioned adjacent to the top wall 20 of the electronic cabinet 12. When the connector 121 of the second conductor 120 is not used, a protective cover 123 (see FIG. 6) may preferably be provided that covers the connector 121. In the embodiment shown, for example, eight conductors may be electrically connected to the second bus bar 80 and may extend to the top wall 20 of the cabinet 12. Each of the eight conductors may preferably be any conventional flexible conductor.

As shown in FIG. 1, at least one conductor 140 may preferably be electrically connected to conductor 120 and to one of the power filters 14, 15, 17, 19. In the embodiment shown, for example, eight conductors may be electrically connected to conductors 120 and to the power filters 14, 15, 17, 19. The conductor 140 routes input power from the conductors 120 to one of the power filters 14, 15, 17, 19. In the embodiment shown, for example, eight flexible conductors may be used to make the interconnection between the eight connectors 121 at the top wall 20 of the cabinet 12 and the power filters 14, 15, 17, and 19. Each of the eight conductors may preferably be any conventional flexible conductor.

Referring to FIG. 8, a power distribution panel 150 may preferably be mounted within the cabinet 12. The power distribution panel 150 is electrically connected between the power filters 14, 15, 17, 19 and the second bus bar 80. The power distribution panel 150 may preferably serve as a breaker panel for incoming power that has been filtered by the power filters 14, 15, 17, 19. Power may be routed from the power filters 14, 15, 17, 19 to the power distribution panel 150 by any conventional means. The power distribution panel 150 may preferably be any conventional circuit breaker.

As shown in FIG. 8, at least one conductor 160 may preferably be electrically connected to the power distribution panel 150 and to the second bus bar 80. In the embodiment shown, for example, a plurality of conductors 160 may be electrically connected to the power distribution panel 150 and to the second bus bar 80. The conductor 160 routes filtered power from the power distribution panel 150 to the second bus bar 80. In particular, one end of the conductors 160 may be hardwired to the power distribution panel 150. The other end of the conductor 160 may include a connector 163 that is received in one of the power input connectors 82, 84, 86, 88 (see FIG. 2) of the second bus bar 80. The conductor 160 may preferably be any conventional flexible conductor.

As shown in FIGS. 1–8, the system 10 may be used for distributing power to a plurality of electronic modules 40, 42 housed within the electronics cabinet 12. In particular, the system 10 may be used to distribute power that is brought into the electronics cabinet 12 from below the cabinet 12. A power input cable 62 is electrically connected to the first bus bar 60. In particular, the power input cable 62 may preferably be attached to one of the input terminals 64 of the first bus bar 60. The first bus bar 60 is electrically connecting to the second bus bar 80. This may be accomplished by connecting a first conductor 110 from the first bus bar 60 to the second bus bar 80. In particular, the first conductor 110 may be connected to one of the output terminals 68 of the first bus bar 60 and to the second bus bar 80. The second bus bar 80 is electrically connected to the power filter 14. In particular, a third conductor 140 is electrically connected to a second conductor 120 and to one of the power filters 14,15, 17,19. Input power is routed from the first bus bar 60 to the second bus bar 80. The input power then routed from the second bus bar 80 to one of the power filters 14, 15, 17, 19. Filtered power is routed from the power filters 14, 25, 17, 19 back to the second bus bar 80, and filtered power is routed from the second bus bar 80 to one of the electronic modules 40, 42. It should be understood that the second bus bar 80 may be comprised of two separate bus bars that together perform the function of the second bus bar 80.

The power filters 14, 15, 17, 19 may preferably be electrically connected to the power distribution panel 150. The power distribution panel 150 may preferably be electrically connected to the second bus bar 80. The filtered power may preferably be routed from the power filters 14, 15, 17, 19 to the power distribution panel 150, and the filtered power may be routed from the power distribution panel 150 to the second bus bar 80.

The system 10 may also be used to distribute power that is brought into the electronics cabinet 12 from above the cabinet 12 as shown in FIG. 9. At least one power input cable 170 is electrically connected to one of the power filters 14, 15, 17, 19. A fourth conductor 160 is electrically connected to the power distribution panel 150 and one of the power input connectors 82, 84, 86 and 88 on the second bus bar 80. Input power is routed to one of the power filters 14,15, 17, 19. Filtered power is routed from one of the power filters 14, 15, 17, 19 to the power distribution panel 150. Filtered power is routed from the power distribution panel 150 to the second bus bar 80, and the filtered power is routed from the second bus bar 80 to at least one of the electronic modules 40, 42.

One advantage of the system 10 is that any one of the electronic modules 40, 42 can be quickly and easily removed from the cabinet 12 without disturbing the surrounding electronic modules due to the removal or rerouting of cables to and from the power distribution panel 150. In particular, an electronic module can be quickly and easily disconnected electrically from the second bus bar 80.

Moreover, the removal and replacement of the power distribution panel 150 can be accomplished quickly and easily without requiring the removal and/or rerouting of power cables to the various electronic modules 40, 42. Again, the power distribution panel 150 can be quickly and easily disconnected from the second bus bar 80.

The system 10 also eliminates the large number of cables within the electronics cabinet 12 that typically are required to supply power to the plurality of electronic modules 40, 42. This in turn results in additional free space in the cabinet 12 for other electronic functions, and increases the airflow through the cabinet 12 to prevent overheating of the electronic components within the cabinet 12. The reduction in the number of power cables also decreases the amount of electromagnetic interference generated within the cabinet 12, and alleviates the cable management problems associated with routing a large number of cables with the cabinet 12.

When power is introduced into the cabinet 12 through the bottom wall 22 of the cabinet 12, the system 10 (and particularly the second bus bar 80) routes input power from the bottom wall 22 to the filters 14, 15, 17, 19 at the top of the cabinet 12. At the same time, the system 10 routes filtered power back to the plurality of electronic modules 40, 42. This also greatly reduces the number of power cables needed within the cabinet 12 to deliver the input power up through the cabinet 12 to the filters 14, 15, 17, 19 at the top of the cabinet 12.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A system for distributing power to a plurality of electronic modules housed within an electronics cabinet comprising:

an electronics cabinet including a top wall, a bottom wall, and a side wall, at least one power filter mounted to the top wall of the electronics cabinet, at least one electronic module housed within the electronics cabinet, a first bus bar positioned within the electronics cabinet and mounted to the bottom wall of the electronics cabinet for receiving at least one power input cable, a second bus bar positioned within the electronics cabinet adjacent to the side wall of the electronics cabinet, the second bus bar extending along a length of the side wall, the second bus bar electrically connected to the first bus bar and to the power filter, the second bus bar including a first conductive layer to transmit power from the first bus bar to the power filter, a second conductive layer to transmit filtered power from the power filter to the at least one electronic module, and an insulative layer positioned between the first conductive layer and the second conductive layer to electrically isolate the first conductive layer from the second conductive layer, wherein the second bus bar routs input power from the first bus bar to the power filter and routs filtered power to the at least one electronic module.

2. The apparatus of claim 1 wherein the bottom wall includes at least one opening adjacent to the first bus bar to allow a plurality of power input cables to be routed into the electronics cabinet.

3. The apparatus of claim 1 wherein the second bus bar includes at least one power input connector to receive filtered power.

4. The apparatus of claim 3 wherein the at least one power input connector comprises a six position connector.

5. The apparatus of claim 3 wherein the at least one power input connector comprises four power input connectors.

6. The apparatus of claim 1 wherein the second bus bar includes at least one power output connector to provide power to the at least one electronic module.

7. The apparatus of claim 6 wherein the at least one output connector comprises a three position connector.

8. The apparatus of claim 6 wherein the at least one power output connector comprises ten power output connectors.

9. The apparatus of claim 1 wherein the second bus bar is a generally planar member having a rectangular shape.

10. The apparatus of claim 1 wherein the first bus bar includes a plurality of input terminals to receive a plurality of power input cables.

11. The apparatus of claim 10 further comprising a first protective cover, the first protective cover covering the plurality of input terminals.

12. The apparatus of claim 1 wherein the first bus bar includes a plurality of output terminals.

13. The apparatus of claim 12 further comprising a second protective cover, the second protective cover covering the plurality of output terminals.

14. The apparatus of claim 1 wherein the first bus bar has a T-shaped configuration.

15. The apparatus of claim 1 further comprising a first conductor electrically connecting the first bus bar to the second bus bar to rout the input power from the first bus bar to the second bus bar.

16. The apparatus of claim 1 further comprising a second conductor electrically connected to the second bus bar and extending to a top wall of the electronics cabinet to rout power from the second bus bar to the top wall of the electronics cabinet.

17. The apparatus of claim 16 further comprising a third conductor electrically connected to the second conductor and to the power filter to rout power from the second bus bar to the power filter.

18. The apparatus of claim 1 wherein the at least one power filter comprises four power filters.

19. The apparatus of claim 1 further comprising a power distribution panel mounted within the electronics cabinet, the power distribution panel electrically connected to the power filter and to second bus bar.

20. The apparatus of claim 19 further comprising a fourth conductor electrically connected to the power distribution panel and to the second bus bar to rout filtered power from the power distribution panel to the second bus bar.

21. A system for distributing power to a plurality of electronic modules housed within an electronics cabinet comprising:

an electronics cabinet including a top wall, a bottom wall, and a side wall, at least one power filter mounted to the top wall of the electronics cabinet, a power distribution panel positioned within the electronics cabinet and electrically connected to the at least one power filter, at least one electronic module housed within the electronics cabinet, a first bus bar positioned within the cabinet, a second bus bar positioned within the electronics cabinet adjacent to the sidewall of the electronics cabinet and extending along a length of the sidewall, the second bus bar including a first conductive layer to transmit power from the first bus bar to the power filter, a second conductive layer to transmit filtered power from the power filter to the at least one electronic module, and an insulative layer positioned between the first conductive layer and the second conductive layer to electrically isolate the first conductive layer from the second conductive layer, the second bus bar including at least one power input connector and at least one power output connector, a conductor electrically connected to the power distribution panel and the at least one power input connector to rout filtered power from power distribution panel to the at least one electronic module.

22. A method of distributing power to a plurality of electronic modules housed within an electronics cabinet comprising the steps of:

provided an electronics cabinet including a top wall, a bottom wall, and a side wall and at least one power filter mounted to the top wall of the electronics cabinet, at least one electronic module housed within the electronics cabinet, a first bus bar positioned within the electronics cabinet and mounted to the bottom wall of the electronics cabinet and a second bus bar positioned within the electronics cabinet adjacent to the side wall of the electronics cabinet, the second bus bar extending along a length of the side wall, the second bus bar including a first conductive layer to transmit power from the first bus bar to the power filter, a second conductive layer to transmit filtered power from the power filter to the at least one electronic module, and an insulative layer positioned between the first conductive layer and the second conductive layer to electrically isolate the first conductive layer from the second conductive layer;

electrically connecting at least one power input cable to the first bus bar;

electrically connecting the first bus bar to the second bus bar;

electrically connecting the second bus bar to the at least one power filter;

routing input power from the first bus bar to the second bus bar;

routing input power from the second bus bar to the power filter;

routing filtered power from the power filter to the second bus bar; and routing filtered power from the second bus bar to the at least one electronic module.

23. The method of claim 22 further comprising the steps of:

providing a power distribution panel;

electrically connecting the power filter to the power distribution panel;

electrically connecting the power distribution panel to the second bus bar;

routing the filtered power from the power filter to the power distribution panel; and routing the filtered power from the distribution panel to the second bus bar.

24. A method of distributing power to a plurality of electronic modules housed within an electronics cabinet comprising the steps of:

providing an electronics cabinet including a top wall, a bottom wall, and a side wall and at least one power filter mounted to the top wall of the electronics cabinet, a power distribution panel positioned within the electronics cabinet and electrically connected to the at least one power filter, at least one electronic module housed within the electronics cabinet, a first bus bar positioned within the cabinet, a second bus bar positioned within the electronics cabinet adjacent to the sidewall of the electronics cabinet and extending along a length of the sidewall, the second bus bar including a first conductive layer to transmit power from the first bus bar to the power filter, a second conductive layer to transmit filtered power from the power filter to the at least one electronic module, and an insulative layer positioned between the first conductive layer and the second conductive layer to electrically isolate the first conductive layer from the second conductive layer, the second bus bar including at least one power input connector and at least one power output connector;

electrically connecting at least one power input cable to the power filter;

electrically connecting a conductor to the power distribution panel and to the at least one power input connector;

routing input power to the power filter;

routing filter power from the power filter to the power distribution panel;

routing filtered power from the power distribution panel to the second bus bar; and routing filtered power from the second bus bar to the at least one electronic module.

25. The method of claim 24 further comprising the steps of:

routing earth ground from the bus bar to the at least one electronic module.

* * * * *

UNITED STATES PATENT AND TRADEMARK OFFICE
CERTIFICATE OF CORRECTION

| | |
|---|---|
| PATENT NO. | : 6,301,095 B1 |
| DATED | : October 9, 2001 |
| INVENTOR(S) | : Kenneth S. Laughlin, Laura M. Bendikas and Daniel J. Lecinski |

It is certified that error appears in the above-identified patent and that said Letters Patent is hereby corrected as shown below:

<u>Title page,</u>
Item [57], ABSTRACT,
Lines 10 and 11, please change the word "routes" to -- routs --.

Signed and Sealed this

Fourth Day of March, 2003

JAMES E. ROGAN
*Director of the United States Patent and Trademark Office*